US009929288B2

United States Patent
Moslehi et al.

(10) Patent No.: US 9,929,288 B2
(45) Date of Patent: Mar. 27, 2018

(54) TRENCH ISOLATION FOR MONOLITHICALLY ISLED SOLAR PHOTOVOLTAIC CELLS AND MODULES

(71) Applicant: Solexel, Inc., Milpitas, CA (US)

(72) Inventors: Mehrdad M. Moslehi, Los Altos, CA (US); Virendra V. Rana, Los Gatos, CA (US); Heather Deshazer, Palo Alto, CA (US); Pawan Kapur, Burlingame, CA (US)

( * ) Notice: Subject to any disclaimer, the term of this patent is extended or adjusted under 35 U.S.C. 154(b) by 0 days.

(21) Appl. No.: 14/846,537

(22) Filed: Sep. 4, 2015

(65) Prior Publication Data

US 2016/0190366 A1 Jun. 30, 2016

Related U.S. Application Data

(63) Continuation of application No. 14/601,202, filed on Jan. 20, 2015, now Pat. No. 9,130,076, and a
(Continued)

(51) Int. Cl.
*H01L 31/0224* (2006.01)
*H01L 31/18* (2006.01)
*H01L 27/142* (2014.01)
*H01L 31/05* (2014.01)
*H01L 31/068* (2012.01)

(52) U.S. Cl.
CPC .. *H01L 31/022458* (2013.01); *H01L 27/1421* (2013.01); *H01L 31/022441* (2013.01); *H01L 31/0516* (2013.01); *H01L 31/0682* (2013.01); *H01L 31/18* (2013.01);
(Continued)

(58) Field of Classification Search
CPC ........... H01L 31/02241; H01L 31/0516; H01L 31/1804; H01L 31/0682; H01L 27/142; H01L 27/1421; H01L 31/022458; H01L 31/022441; H01L 31/18; Y02E 10/547; Y02P 70/521

See application file for complete search history.

(56) References Cited

U.S. PATENT DOCUMENTS 4,234,352 A * 11/1980 Swanson ..................... F24J 2/07
   136/253
5,510,271 A * 4/1996 Rohatgi ............ H01L 31/02168
   136/261
5,641,362 A * 6/1997 Meier ............. H01L 31/022441
   136/255
(Continued)

*Primary Examiner* — Caridad Everhart

(74) *Attorney, Agent, or Firm* — Howard IP Law Group PC

(57) ABSTRACT

Fabrication methods and structures are provided for the formation of monolithically isled back contact back junction solar cells. In one embodiment, base and emitter contact metallization is formed on the backside of a back contact back junction solar cell substrate. A trench stop layer is formed on the backside of a back contact back junction solar cell substrate and is electrically isolated from the base and emitter contact metallization. The trench stop layer has a pattern for forming a plurality semiconductor regions. An electrically insulating layer is formed on the base and emitter contact metallization and the trench stop layer. A trench isolation pattern is formed through the back contact back junction solar cell substrate to the trench stop layer which partitions the semiconductor layer into a plurality of solar cell semiconductor regions on the electrically insulating layer.

17 Claims, 10 Drawing Sheets

Related U.S. Application Data continuation-in-part of application No. 14/179,526, filed on Feb. 12, 2014, and a continuation-in-part of application No. 14/072,759, filed on Nov. 5, 2013.

(60) Provisional application No. 61/929,097, filed on Jan. 19, 2014, provisional application No. 61/763,580, filed on Feb. 12, 2013, provisional application No. 61/859,602, filed on Jul. 29, 2013, provisional application No. 61/722,620, filed on Nov. 5, 2012.

(52) U.S. Cl.
CPC ........ *H01L 31/1804* (2013.01); *Y02E 10/547* (2013.01); *Y02P 70/521* (2015.11)

(56) References Cited

U.S. PATENT DOCUMENTS

| | | | | |
|---|---|---|---|---|
| 2006/0060238 A1* | 3/2006 | Hacke | ................... | H01L 31/068 136/256 |
| 2008/0035198 A1* | 2/2008 | Teppe | ............. | H01L 31/022433 136/256 |
| 2010/0218816 A1* | 9/2010 | Guha | ................. | H01L 31/0682 136/256 |
| 2012/0040487 A1* | 2/2012 | Asthana | ............ | H01L 31/02245 438/64 |
| 2013/0260505 A1* | 10/2013 | Bedell | ................... | H01L 27/142 438/67 |
| 2013/0291932 A1* | 11/2013 | Bateman | ............. | H01L 31/0682 136/255 |
| 2014/0076392 A1* | 3/2014 | Lin | ...................... | H01L 31/073 136/256 |

\* cited by examiner

TRENCH ISOLATION FOR MONOLITHICALLY ISLED SOLAR PHOTOVOLTAIC CELLS AND MODULES

CROSS-REFERENCE TO RELATED APPLICATIONS

This application is a continuation of U.S. application Ser. No. 14/601,202 filed Jan. 20, 2015 which claims the benefit of U.S. Provisional Application No. 61/929,097 filed on Jan. 19, 2014, and is also a continuation-in-part of U.S. patent application Ser. No. 14/179,526 filed Feb. 12, 2014 which claims the benefit of U.S. Provisional Application Nos. 61/763,580 filed Feb. 12, 2013 and 61/859,602 filed Jul. 29, 2013, and is a continuation-in-part of U.S. patent application Ser. No. 14/072,759 filed Nov. 5, 2013 which claims the benefit of 61/722,620 filed Nov. 5, 2012, all of which are hereby incorporated by reference in their entirety.

FIELD OF THE INVENTION

The present disclosure relates in general to the fields of solar photovoltaic (PV) cells, and more particularly to monolithically isled (or monolithically partitioned) solar cells.

BRIEF SUMMARY OF THE INVENTION

Therefore, a need has arisen for improved back contact solar cell structures and fabrication processes that provide increased solar cell performance. In accordance with the disclosed subject matter, back contact solar cell fabrication methods and structures having trench isolation utilizing a trench stop layer are provided which may substantially eliminate or reduce disadvantages and deficiencies associated with previously developed back contact solar cells.

According to one aspect of the disclosed subject matter, a monolithically isled back contact back junction solar cell is provided. The back contact back junction solar cell comprises base and emitter contact metallization on the backside of a back contact back junction solar cell substrate. A trench stop layer is on the backside of a back contact back junction solar cell substrate which is electrically isolated from the base and emitter contact metallization. The trench stop layer has a pattern for forming a plurality semiconductor regions. An electrically insulating layer is on the base and emitter contact metallization and the trench stop layer. A trench isolation pattern is formed through the back contact back junction solar cell substrate to the trench stop layer which partitions the semiconductor layer into a plurality of solar cell semiconductor regions on the electrically insulating layer.

According to another aspect of the disclosed subject matter, a method for forming a monolithically isled back contact back junction solar cell is provided. Base and emitter contact metallization is formed on the backside of a back contact back junction solar cell substrate. A trench stop layer is formed on the backside of a back contact back junction solar cell substrate and which is electrically isolated from the base and emitter contact metallization. The trench stop layer has a pattern for forming a plurality semiconductor regions. An electrically insulating layer is formed on the base and emitter contact metallization and the trench stop layer. A trench isolation pattern is formed through the back contact back junction solar cell substrate to the trench stop layer which partitions the semiconductor layer into a plurality of solar cell semiconductor regions on the electrically insulating layer.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages that are included within this description, be within the scope of any claims.

BRIEF DESCRIPTION OF THE DRAWINGS

The features, natures, and advantages of the disclosed subject matter may become more apparent from the detailed description set forth below when taken in conjunction with the drawings in which like reference numerals indicate like features and wherein.

BACKGROUND

Figure 1:
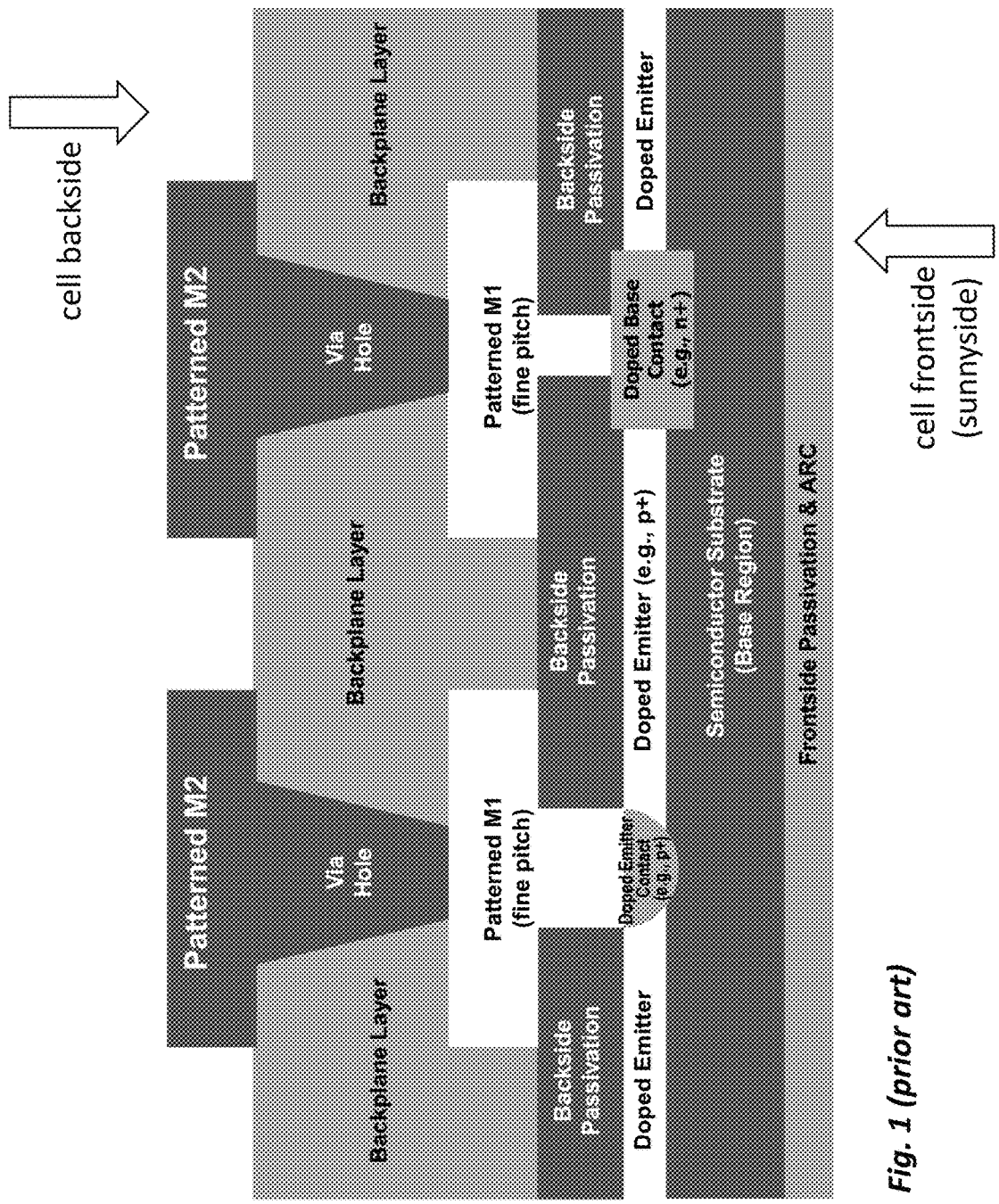
FIG. 1 is a cross-sectional diagram of a back contact back junction solar cell.

As solar photovoltaic technology is adopted as an energy generation solution on an increasingly widespread scale, fabrication and efficiency improvements relating to solar cell efficiency, metallization, material consumption, and fabrication are required. Generally, solar cell contact structure includes emitter and base contact regions, such as contact diffusion regions, contacting conductive metallization—for example metallization connecting silicon in base and emitter contact areas through relatively heavy phosphorous and boron areas, respectively (for instance, for solar cells using n-type base region and p-type emitter region). Manufacturing cost and conversion efficiency factors are driving solar cell semiconductor absorbers ever thinner in thickness and larger in area, thus, increasing the mechanical fragility, solar cell power, and complicating processing and handling of these thin absorber based solar cells—fragility effects increased particularly with respect to crystalline silicon absorbers.

Current crystalline silicon (or other semiconductor absorber material) solar cell structures and processing methods often suffer from several disadvantages relating to cell bow and cell cracking/breakage during and/or after cell processing as well as during the operation of crystalline silicon PV modules installed in the field. Solar cell processing often induces significant process and material induced stresses (e.g., thermal and/or mechanical stresses) on a semiconductor substrate which may lead to thermally-induced warpage and crack generation and propagation (by thermal cycling or mechanical stresses). Bowed or non-planar solar cell substrates pose significant challenges and possible manufacturing yield degradation during solar cell processing (such as during processing of crystalline silicon solar cells), and may also present requirements for clamping down the solar cell substrate and/or the substrate edges onto a supporting substrate carrier to flatten the cell substrate during manufacturing process. Flattening solutions may complicate the solar cell manufacturing process resulting in increased manufacturing cost and/or some manufacturing throughput and yield compromises. Bowed or non-planar solar cell substrates may further result in cell microcracks and/or breakage problems during module lamination and also subsequently during the PV module operation in the field (resulting in PV module power degradation or loss). These problems may be further aggravated in larger area solar cells, such as the commonly used 156 mm×156 mm format (square or pseudo square) solar cells.

Further, conventional solar cells, particularly those based on an interdigitated back-contact or IBC design, often require relatively thick metallization patterns—due to the relatively high cell electrical current which must be extracted and delivered from the solar cell—which may add complexity to cell processing, increase material costs, and add significant physical stresses to the cell semiconductor material. Thermal and mechanical stresses induced by relatively thick (e.g., in the thickness range of 10's of microns for IBC cell metallization, for instance, about 30 to 100 microns of copper or aluminum) metallization patterns on the solar cell frontside and/or backside, coupled with the coefficient of thermal expansion or CTE mismatch between conductive metals (e.g., plated copper used for IBC solar cells or screen-printed aluminum-containing and/or silver-containing metallization pastes used for conventional front-contact solar cells) and semiconductor materials (e.g., thin crystalline silicon absorber layer) may substantially increase the risk of producing microcracks, cell breakage, and cell bowing during cell processing (i.e., during and after cell metallization) and module processing (during and after cell-to-cell interconnections and module lamination assembly) as well as during field operation of the installed PV modules (i.e. due to weather conditions, temperature changes, wind-induced and/or snow-load-induced and/or installation-related module bending stresses).

DETAILED DESCRIPTION

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

And although the present disclosure is described with reference to specific embodiments and components, such as a back contact back junction (BCBJ) silicon solar cell, one skilled in the art could apply the principles discussed herein to other solar cell structures solar cell semiconductor materials (such as GaAs, other compound III-V materials, etc.), fabrication processes (such as various deposition, contact opening, and diffusion methods and materials), as well as absorber/passivation/metallization materials and formation, technical areas, and/or embodiments without undue experimentation.

Fabrication methods and structures are provided for the formation of monolithically isled (or monolithically partitioned) solar cells (which may be referred to herein as iCells). The fabrication methods and structures provided for the formation of monolithically isled solar cells may utilize, in whole or in part, the fabrication processes and structures found in patent applications U.S. Pub. No. 2014/0326295 published Nov. 6, 2014 and U.S. Pub. No. 2014/0370650 published Dec. 18, 2014, both of which are hereby incorporated by reference in their entirety.

Monolithically isled crystalline silicon solar cells where the solar cell silicon absorber is separated into a plurality of islands formed by partitioning trench isolation structures provide several key benefits. The separation of the silicon absorber (and/or any other suitable semiconductor material including but not limited to GaAs) layer into a plurality of trench-partitioned islands is carried out after attaching the silicon layer to a backplane sheet, for instance, a flexible thin sheet of a suitable prepreg material by a thermal lamination process, using a suitable trench formation technique such as pulsed laser ablation, mechanical sawing, ultrasonic cutting, plasma etching/sawing, etc. The monolithically-formed isled (or tiled) silicon layer is supported on a backplane sheet (e.g., a laminated prepreg sheet). It is important that this backplane (e.g., a relatively thin prepreg sheet having a thickness in the range of about 25 microns up to about 300 microns and in some instances having a thickness range of about 50 microns to 200 microns) not be substantially affected by the silicon (or semiconductor) cut process forming the resulting trench isolation structure.

A solution provided herein utilizes a trench stop layer (also referred to as an ablation stop, etch stop, or cut stop layer) such that the silicon cutting process to form the trench isolation structure for trench-partitioned islands or tiles or isles is substantially stopped at the ablation or etch stop layer—thus protecting the backplane. The etch stop solution provided may be readily integrated and implemented into existing monolithically isled solar cell process flows, such as those noted above, and in some instances may enhance the manufacturing yield and reliability of the resulting solar cells and modules without adding an additional process step or process equipment to the manufacturing process flow.

As noted previously, structures, systems, and methods for monolithically isled solar photovoltaic cells and modules may be found in patent applications U.S. Pub. No. 2014/0326295 published Nov. 6, 2014 and U.S. Pub. No. 2014/0370650 published Dec. 18, 2014, both of which have been and are hereby incorporated by reference in their entirety. As disclosed, the solar cell consists of a silicon absorber with a textured and passivated, light facing front side (also called the sunnyside of the solar cell) and a back junction, back contact structure with two-level metallization comprising interdigitated metallization supported on the cell absorber backside and on an electrically insulating backplane attached to the cell backside. A first level metal (M1), for example an interdigitated metallization pattern, is formed on the back surface of the silicon absorber (a patterned M1 on the backside passivated surface of the absorber with contact openings to the absorber backside base and emitter regions), and a second level of metal (M2), for example an interdigitated metallization pattern, structure is formed on the other side (exposed non-laminated side or surface) of the electrically insulating backplane. The two levels of metal (M1 and M2) are connected through vias drilled into the electrically insulating backplane and conductive via plugs formed through these laser-drilled via holes during the M2 formation process. FIG. 1 is a cross-sectional diagram of this solar cell structure. Note, although patterned M1 and patterned M2 are shown in a parallel orientation in FIG. 1 to emphasize electrical interconnection, M1 and M2 are typically and preferably patterned in an orthogonal pattern—in other words the interdigitated fingers of M2 are formed perpendicular to the interdigitated fingers of M1.

Figure 2:
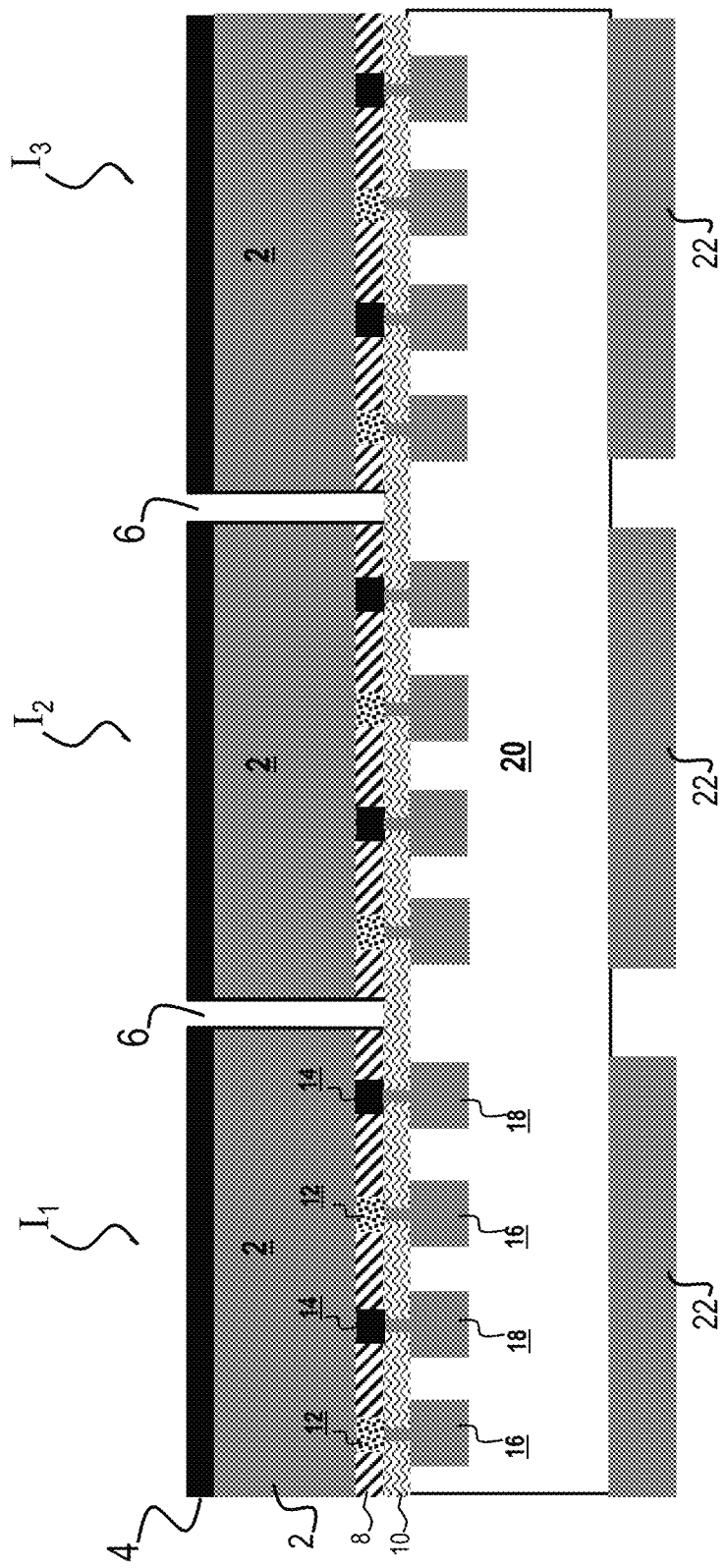
FIG. 2 is a cross-sectional diagram depicting key structure of a monolithically isled solar cell.

The structure of FIG. 1 may be repeated over the full area of the backplane-attached solar cell. The semiconductor absorber (e.g., crystalline silicon absorber) is cut or scribed (or diced) or etched into trench-partitioned islands (also referred to as isles, tiles, sub-cells, or mini-cells) with all the islands supported on the attached continuous electrically insulating backplane so that the photon collection and current generation is separated into a plurality of different regions or absorber islands separated by trench isolation borders—resulting in a monolithically isled solar cell. FIG. 2 is a cross-sectional diagram depicting key structure of a monolithically isled solar cell. As shown in FIG. 2, continuous electrically insulating backplane 20 supports subcells (or isles or islands) $I_1$, $I_2$, and $I_3$ formed of semiconductor absorber (e.g., silicon) 2 including emitter layer 8 and separated by partitioning trenches 6. Passivation and anti-reflection coating (ARC) layer 4 is formed on the semiconductor absorber frontside/sunnyside and partitioning trenches surface. First level metal M1 is positioned on passivating dielectric layer 10 and comprises emitter metallization 16 contacted to emitter contact 12 and base metallization 18 contacted to base contact (e.g., N++ or heavily phosphorus doped base contact when using n-type base) 14. Second level metal M2 22 is positioned on the backplane and electrically connects to emitter metallization 16 and base metallization 18—first level metal M1 to second level metal M2 electrical connection not shown in FIG. 2.

The current generated by each island is picked up by its respective patterned first level of metal (M1—typically a substantially interdigitated pattern of M1 fingers). The trench-partitioned regions or semiconductor absorber islands may be connected using different schemes of patterning the second level metal (M2) to control the voltage and the current output (all in series, all in parallel, or a combination of series and parallel electrical connections). Various connection schemes have been described to scale voltage up and scale current down using specific series or parallel-series interconnections of the islands within a solar cell which allows for much thinner metal layers to be used for each metal layer M1 and M2 thus reducing metallization complexity and cost.

The separation of silicon into islands or tiles not only facilitates the use of thinner metal (e.g., much thinner M2) layer but also increases the flexibility of backplane-attached solar cells (further enhanced when used in combination with a flexible backplane material) allowing a higher degree of bendability or flexibility without cracking the absorber. Also, subdividing the absorber layer reduces the stress thereby helping to maintain the overall planarity of cell substrates during solar cell processing (hence, facilitating handling and processing of the solar cells).

The cutting or dicing (also known as scribing) or etching of the semiconductor absorber (e.g., crystalline silicon) layer for forming isolation trenches and subdividing the absorber layer may be carried out, for example, using methods such as pulsed laser ablation, mechanical sawing or dicing, water jet cutting, ultrasonic cutting, patterned plasma or wet etching, printing of an etch paste followed by etching activation and rinsing of the etch paste, or any combination of the methods mentioned here. The semiconductor (e.g., crystalline silicon) absorber layer cut is formed through the semiconductor (e.g., crystalline silicon) absorber layer to the backplane thereby forming the trench-partitioned isles or islands and isolating each island (also referred to as isles, tiles, sub-cells, or mini-cells). The thickness of the semiconductor layer may be, for example, in the range of a few microns up to 100's of microns and in some instances in the range of about 10 microns to about 200 microns for crystalline silicon (and more particularly applicable for crystalline silicon a thickness in the range of about 20 microns to 100 microns when forming the trench isolation cuts). Prior to the trench isolation cuts, the semiconductor absorber layer is permanently attached (e.g., laminated) to a suitable backplane sheet, for instance, a flexible prepreg sheet (or stacked sheets) with a backplane thickness, for example, in the range of about 50 microns up to about 200 microns.

In one embodiment, the semiconductor (e.g., crystalline silicon) absorber layer cutting to form subcells is carried out using pulsed laser ablation, for example using a nanoseconds-range pulse length laser. The pulsed laser scan is carried on the semiconductor (e.g., crystalline silicon) absorber layer surface (opposite the exposed backplane surface) in a manner such the semiconductor (e.g., crystalline silicon) absorber layer is removed or ablated through its thickness to the laminated (or attached) backplane interface (hence, forming the partitioning trenches with relatively narrow trench opening width). In one embodiment, the backplane is a suitable prepreg material (which is commonly used for PCB boards), for example a prepreg material with a relatively closely matched coefficient of thermal expansion (CTE) to the CTE of the semiconductor layer.

A suitable semiconductor (e.g., crystalline silicon) absorber layer removal/cutting process should ensure that the semiconductor (e.g., crystalline silicon) absorber layer is completely removed down to the backplane (e.g., laminated prepreg) interface while not damaging or significantly cutting into the backplane (e.g., laminated prepreg) that may result in a mechanically unstable solar cell laminate and/or cause manufacturing yield degradation. Ideally, the semiconductor (e.g., crystalline silicon) absorber layer removal/cutting process has sufficient removal selectivity with respect to the backplane (e.g., prepreg) material. However, in practice it may be difficult to accomplish this important objective, particularly using a physical removal process such a pulsed laser ablation process. For example, the laser used to remove silicon may often cut into the prepreg layer and remove the prepreg material beyond the removal of the semiconductor (e.g., crystalline silicon) absorber layer. Therefore, in order to ensure that the semiconductor (e.g., crystalline silicon) absorber layer is completely removed in the designated trench isolation regions, the process may result in removing at least a portion of the backplane (e.g., prepreg) material which may then result in undesirable manufacturing yield degradation (particularly if the prepreg removal is excessive). Additionally, a low cost semiconductor (e.g., crystalline silicon) absorber layer cut process may operate at a relatively high throughput. And with respect to laser processing, cut and formation of partitioning trenches (e.g. through crystalline silicon) at a very high scan speed may be needed for high throughput. High throughput may require relatively high laser fluence that may aggravate the challenges and problem of damaging the backplane sheet (e.g., prepreg) by excessive encroachment and cut into it.

The robust trench formation process endpointing scheme provided allows for high throughput semiconductor (e.g., crystalline silicon) absorber layer removal to form the partitioning trenches in some instances without residual semiconductor material left in the designated trench regions and while not damaging or cutting the backplane material (e.g., prepreg) sheet. The semiconductor absorber solution utilizes an etch stop or cut stop layer which acts as a backplane protective landing region for the semiconductor absorber cut and which, in one advantageous embodiment, may be formed at the same time that the patterned M1 layer is formed (e.g., by screen printing of an aluminum-containing paste or a combination of PVD aluminum and laser patterning to form the M1 layer AND the etch stop regions of aluminum). The semiconductor (e.g., crystalline silicon) absorber layer cutting process to form the partitioning trenches stops in the patterned etch stop layer (e.g., patterned Al formed concurrently and using the same process used for M1 formation) such that the backplane material (e.g., prepreg) sheet is not affected or damaged or etched—thus, providing an effective trench formation cut process endpointing scheme allowing for sufficient cutting process to ensure complete removal of the semiconductor material from the designated trench regions without punching through the cut stop (or ablation-stop) layer (e.g., patterned aluminum) and without damaging the backplane sheet.

As noted, a first level metal (M1) pattern (for instance, a patterned metal comprising an aluminum layer formed by a suitable process such as screen printing or a combination of PVD aluminum and laser ablation patterning) is formed such that there is no M1 interconnect corresponding to the isolation trench regions and each trench-partitioned island is electrically isolated (both its partitioned semiconductor absorber layer and its patterned M1 region). The semiconductor absorber cut solution provided includes an additional M1 pattern (e.g., optically reflecting aluminum layer) on the back of semiconductor (e.g., crystalline silicon) absorber layer to act as an etch stop or cut stop layer. This cut stop or process endpointing layer may be formed in conjunction with the M1 formation process and, therefore does not add incremental processing cost. For instance, a screen printing process to form the patterned M1 layer using an aluminum paste material may also form the patterned cut stop aluminum regions using the same screen printing process. The patterned cut stop layer may have essentially the same pattern as the partitioning trenches and its linewidth may be chosen to be slightly larger than the trench width at the bottoms of the partitioning trenches. This etch stop/cut stop metal (e.g., screen printed or PV aluminum layer) pattern is designed such that the cut stop metal layer is not connected to any of the patterned M1 interconnections (e.g., interdigitated aluminum fingers) for the individual isles or minicells—in other words the etch stop/cut stop metal is electrically isolated from the M1 base and emitter metallization.

Figure 3A:
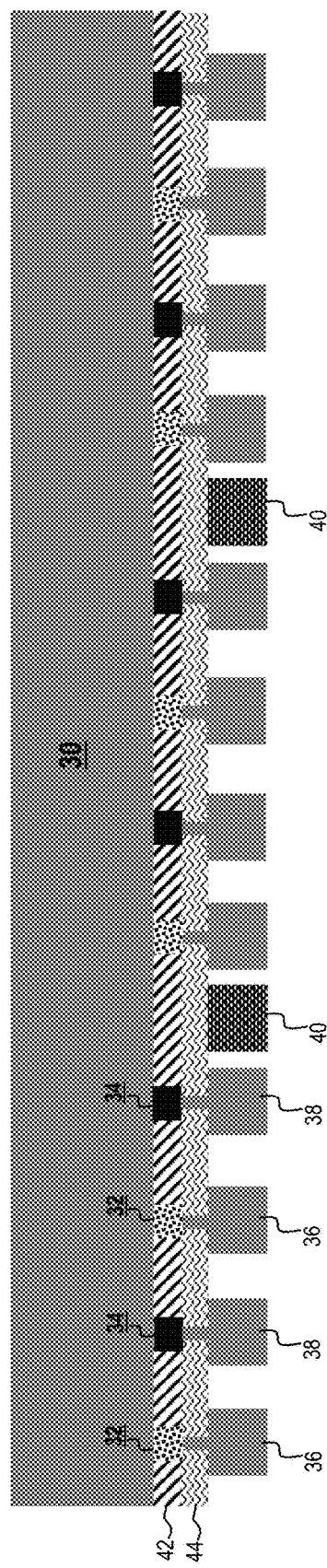
FIGS. 3A to 3D are representational cross-sectional diagrams of a monolithically isled solar cell in accordance with the disclosed subject matter.

Representative processing sequences are shown in the cross-sectional diagrams of FIGS. 3A to 3D. Semiconductor absorber (e.g., silicon) 30 includes emitter layer 42 and emitter contact 32 (e.g., P++ emitter contact) and base contact (e.g., N++ base contact) 34. First level metal M1 is positioned on passivating dielectric layer 44 and comprises emitter metallization 36 contacted to emitter contact 32, base metallization 38 contacted to base contact (e.g., N++ base contact) 34, and metal etch stop (or cut stop layer) 40. Metal etch stop (or cut stop layer) 40 is deposited at the intended silicon trench locations. Patterned etch stop or cut stop metal layer 40 is formed at the time of M1 pattern formation as shown in FIG. 3A.

Figure 3B:
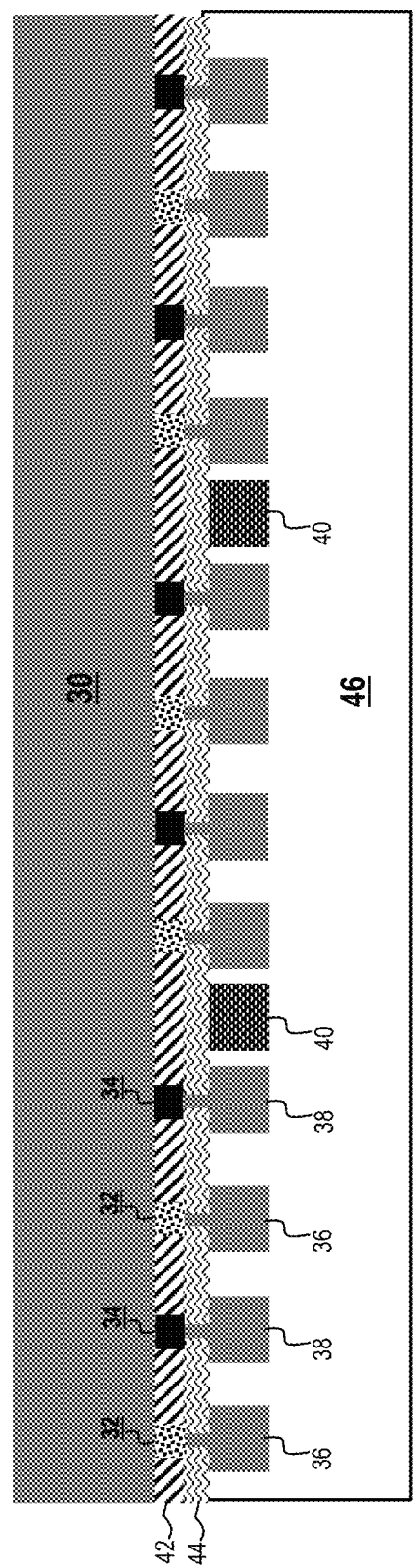

FIG. 3B is cross-sectional diagram of the solar cell consistent with FIG. 3A with continuous electrically insulating backplane layer 46 laminated to the cell backside. In other words, the semiconductor (e.g., crystalline silicon) absorber layer with the back junction back contact pattern of FIG. 3A is laminated to the backplane (e.g., prepreg) in FIG. 3B.

Figure 3C:
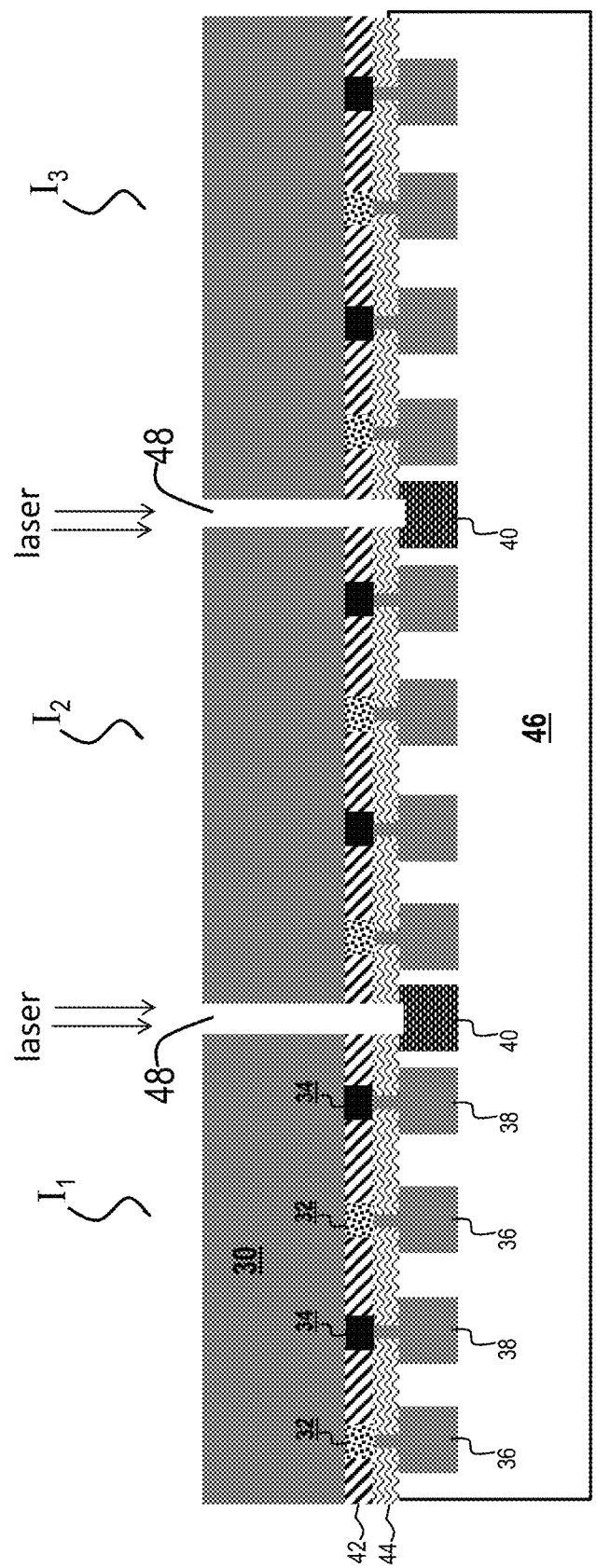

Then, as shown in the cross-sectional diagram of FIG. 3C, the semiconductor cutting process, such as a pulsed laser ablation process, is carried out at the front surface of the semiconductor layer until the semiconductor (e.g., crystalline silicon) absorber layer is completely removed and the metal etch stop is reached at the intended silicon trench locations, forming partitioning trenches (trench isolation borders) without semiconductor residue left in the designated trench bottoms. FIG. 3C is cross-sectional diagram of the solar cell consistent with FIG. 3B with laser formed partitioning trenches 48 formed through semiconductor absorber (e.g., silicon) 30, emitter layer 42, and passivating dielectric layer 44 to metal etch stop 40 and forming subcells (or isles or islands) $I_1$, $I_2$, and $I_3$.

Importantly, the trench stop layer (e.g., metal etch stop layer shown in FIG. 3A) may act as a protective layer for processing such as cleaning the trench after trench formation—in other words the trench stop layer protects the backplane during subsequent processing, such as wet etching for cleaning or etch back or texturing, after trench formation. Metal debris generated by pulsed laser ablation may cause shunts between adjacent islands; however, this debris may be conveniently and readily cleaned up by a subsequent wet etch removal step (e.g., using KOH) for example integrated with an optional semiconductor thinning wet etch process or a subsequent wet etch texturing process using KOH (e.g., the front surface texture step shown in FIG. 4) or another suitable wet etch chemical so that no additional processing step is required. In some instances, silicon debris or residue may be caused by the cutting process (e.g., pulsed laser ablation) as well, this debris may also be removed using a wet etch removal step which may also be integrated in solar cell processing steps.

Figure 3D:
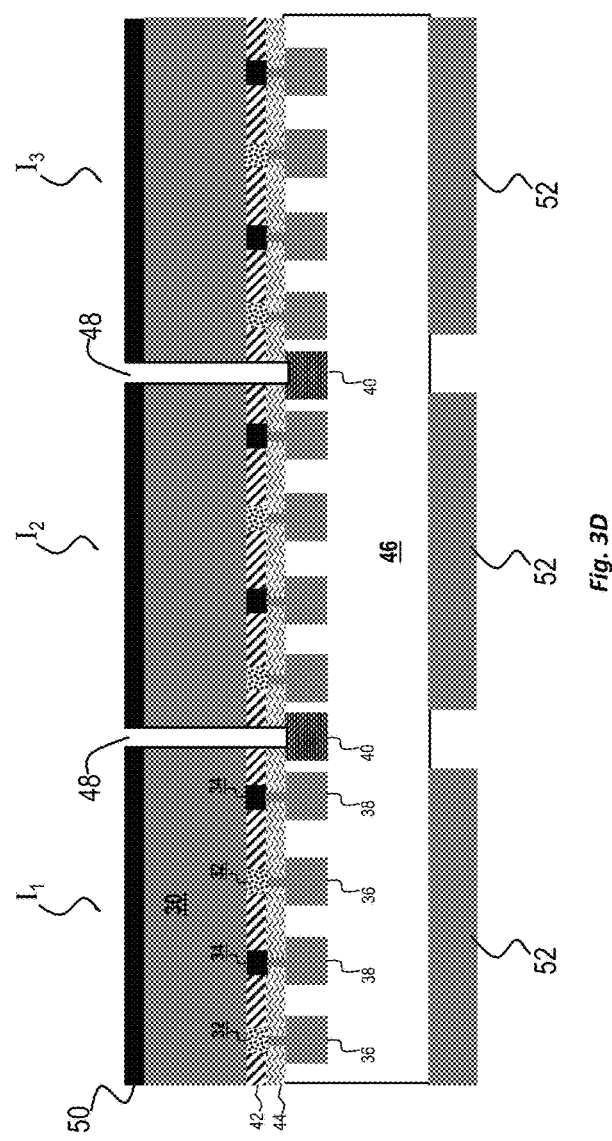

Then, as shown in the cross-sectional diagram of FIG. 3D, solar cell formation may be finalized with the deposition of passivation and anti-reflection coating (ARC) on the front surface, via formation through the backplane for M1 to M2 connection, not shown in FIG. 3D, (e.g., by laser drilling of via holes on the backplane), and subsequent patterned M2 formation (e.g., by a combination of PVD metal and laser ablation patterning) on the back or exposed surface of the backplane. FIG. 3D is cross-sectional diagram of the solar cell consistent with FIG. 3C with passivation and anti-reflection coating (ARC) layer 50 formed on the semiconductor absorber frontside/sunnyside and partitioning trenches surface and second level metal M2 52 positioned on the backplane and electrically connected to emitter metallization 36 and base metallization 38 through conductive vias in backplane 46 (first level metal M1 to second level metal M2 electrical connection and vias not shown in FIG. 3D). If a wet etch silicon thinning etch and/or front surface texturing process is used prior to deposition of the passivation and ARC layer, the ablation stop or cut stop metal regions 40 may be selectively removed during such wet etch process (and not be part of the final solar cell structure).

Figure 4:
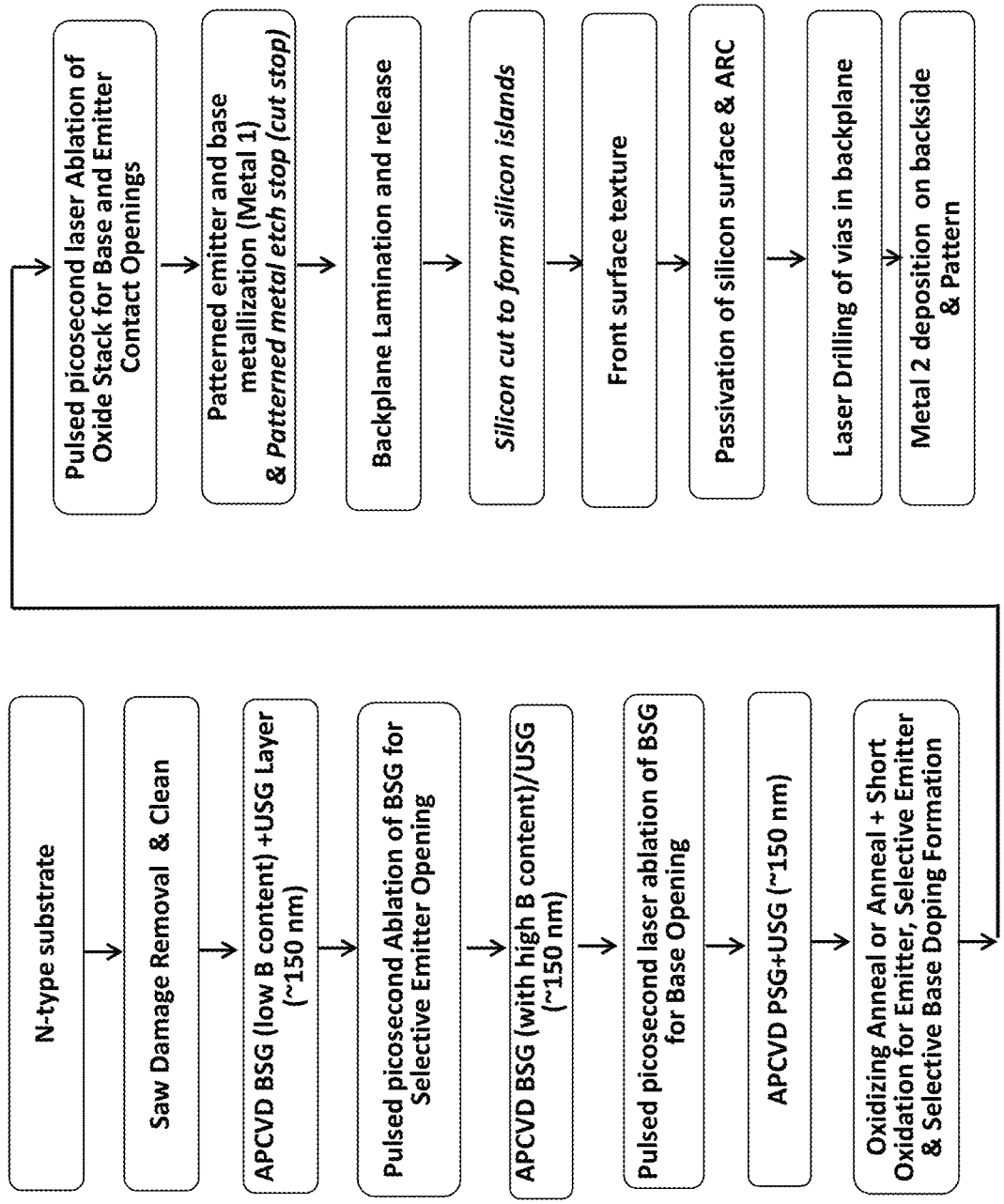
FIG. 4 is a representative process flow for the formation of a monolithically isled solar cell in accordance with the disclosed subject matter.

FIG. 4 is a representative process flow for the formation of a monolithically isled backplane supported back contact solar cell with two-level metallization (such as the solar cell metallization structure shown in FIG. 1) where a patterned metal etch stop (or trench formation cut stop or ablation-stop) layer is formed at the same time as the patterned M1 layer (e.g., by screening printing of aluminum paste or PVD of aluminum and subsequent laser ablation patterning to form patterned M1). In other words, the process for forming the patterned etch stops (or cut stops) at the intended isolation trench locations is the same process as that for M1. Thus, in some instances, additional processing steps are not required and there is no added incremental cost to implement the trench partitioning processing solutions provided. A suitable process such as aluminum (or another material such as nickel) paste screen printing or stencil printing followed by anneal, metal (e.g., aluminum) ink jet printing followed by anneal, or evaporation or PVD followed by laser patterning may be used to form first level metal M1 along with the electrically isolated etch stops.

Figure 5B:
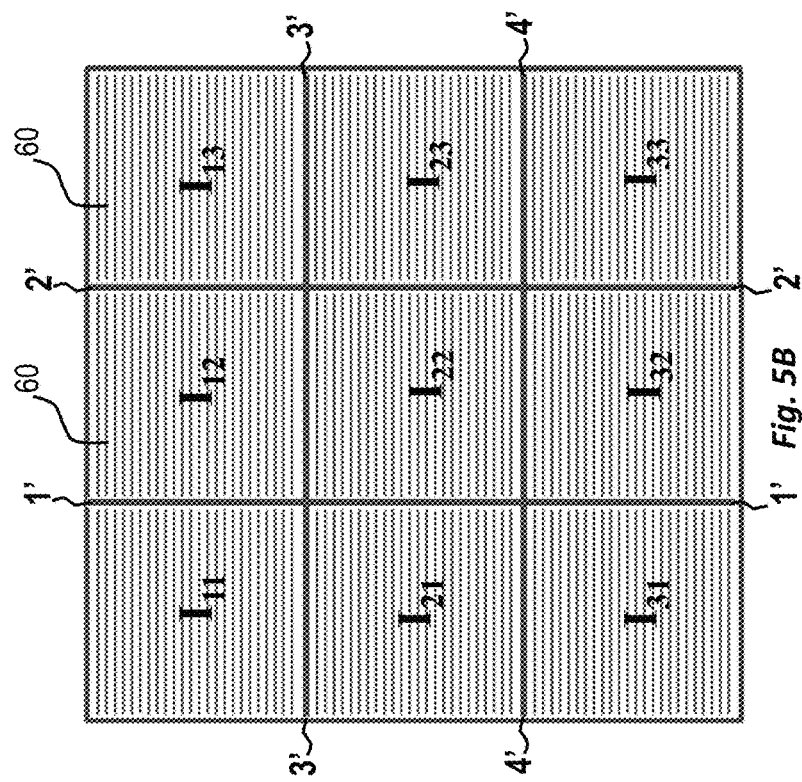
FIG. 5B is a schematic diagram of a solar cell depicting nine square islands $I_{11}$ to $I_{33}$ and having patterned metal etch stops.
Figure 5A:
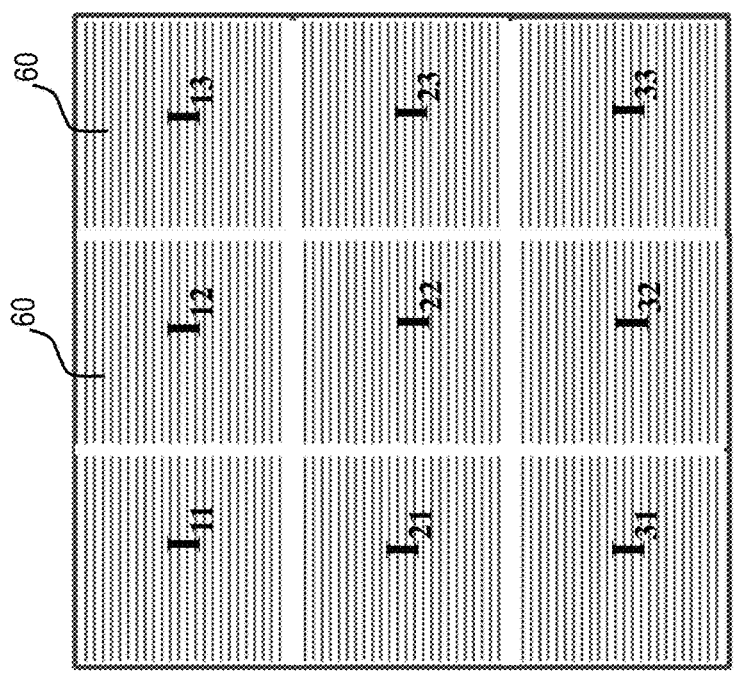
FIG. 5A is a schematic diagram of a solar cell depicting nine square islands $I_{11}$ to $I_{33}$.

The silicon islands (subcells, isles, or tiles) of a solar cell may be all substantially square shaped, rectangular shaped, or a mix of square or rectangles, or polygon shaped such as triangles. FIG. 5A is a schematic diagram of a solar cell depicting nine square islands $I_{11}$ to $I_{33}$ (in a 3×3 array) each having an M1 pattern 60 (e.g., interdigitated aluminum fingers). As shown in FIG. 5A, the regions between square islands $I_{11}$ to $I_{33}$ are for silicon trench formation. FIG. 5B is a schematic diagram depicting nine square islands $I_{11}$ to $I_{33}$ having regions between square islands $I_{11}$ to $I_{33}$ covered with patterned metal etch stops (or cut stops), electrically isolated from M1. As shown in FIG. 5B, patterned metal etch stops comprise strips 1'-1', 2'-2', 3'-3', and 4'-4'. Importantly, these metal etch stops or cut stops (or laser ablation stops if using laser ablation to form the trench isolation regions) may be formed in the same process used to form M1 for each isle (for instance, by screen printing of a paste such as a suitable aluminum paste).

Figure 6B:
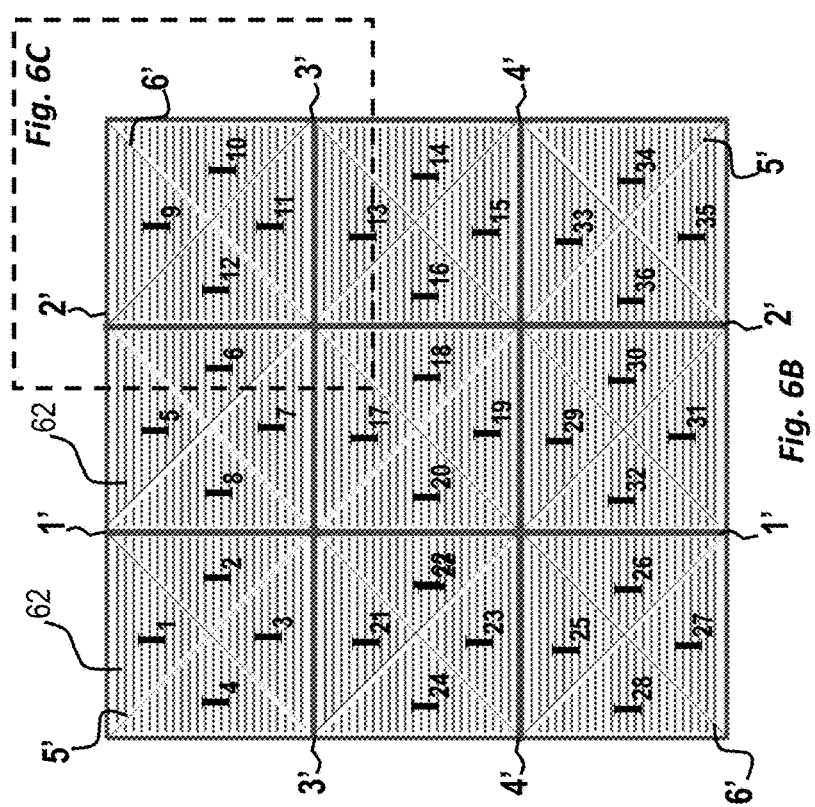
FIG. 6B is a schematic diagram of a solar cell depicting thirty size triangular islands $I_1$ to $I_{36}$ and having patterned metal etch stops.
Figure 6A:
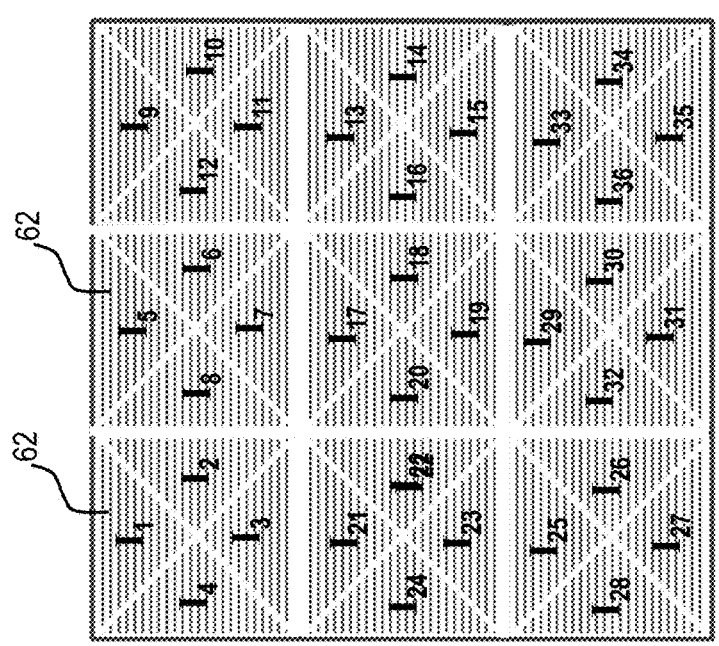
FIG. 6A is a schematic diagram of a solar cell depicting thirty size triangular islands $I_1$ to $I_{36}$.
Figure 6C:
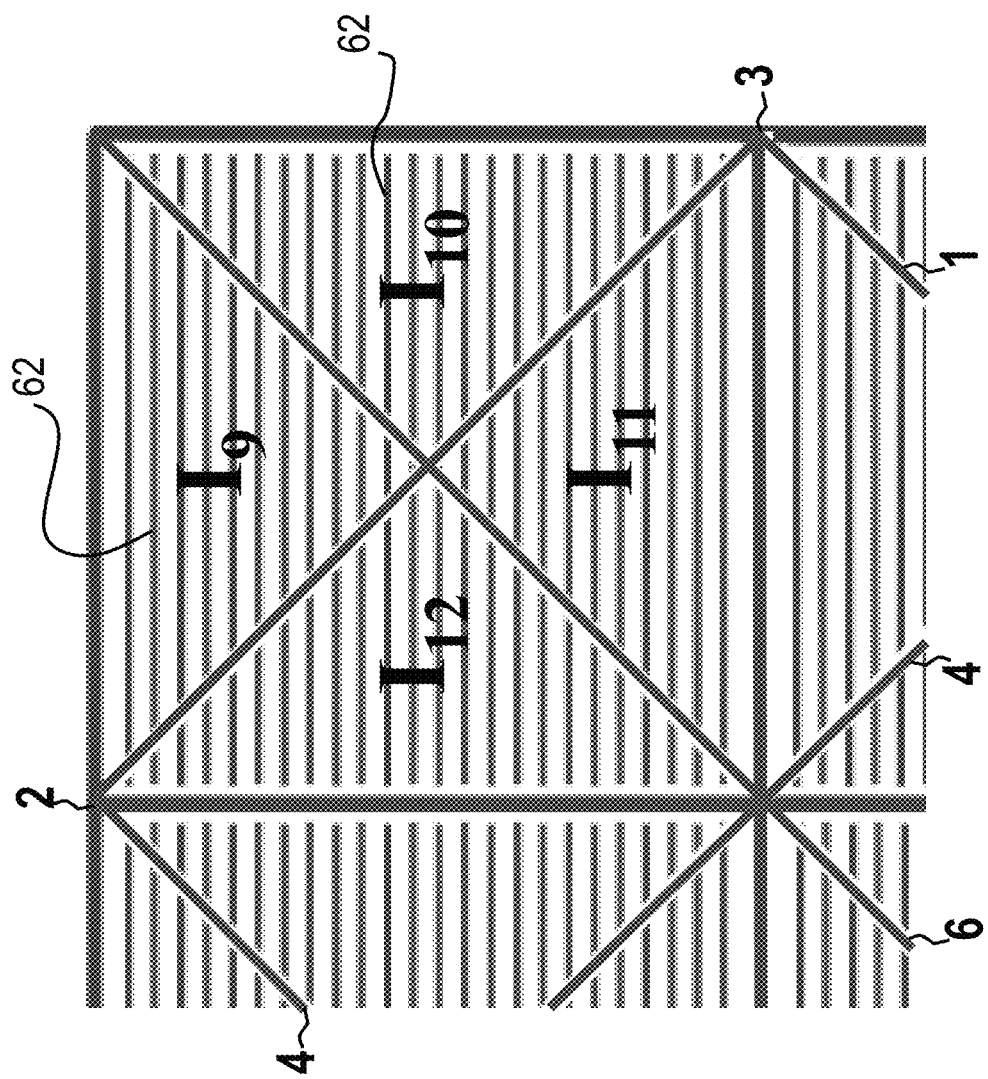
FIG. 6C is an expanded view of a portion of FIG. 6B.

FIG. 6A is a schematic diagram of a solar cell depicting thirty six triangular islands $I_{11}$ to $I_{36}$ each having an M1 pattern 62 (e.g., interdigitated aluminum fingers) with regions between triangular islands $I_{11}$ to $I_{36}$ empty for silicon trench formation. FIG. 6B is a schematic diagram depicting triangular islands $I_{11}$ to $I_{36}$ having regions between square islands $I_{11}$ to $I_{33}$ covered with patterned metal etch stops (or cut stops or ablation stops), electrically isolated from M1. As shown in FIG. 6B, patterned metal etch stops comprise strips 1'-1', 2'-2', 3'-3', 4'-4', 5'-5', 6'-6', 2'-3', 1'-4', 3'-2', 4'-1', 1'-3', 2'-4', 3'-1', and 4'-2'. FIG. 6C is an expanded view of a portion of FIG. 6B for better understanding of the etch stop pattern. Importantly, these metal etch stops may be formed in the same process used to form M1 for each isle (for instance, by screen printing of a paste such as a suitable aluminum paste) for concurrent printing formation of the patterned M1 and cut stop metal regions.

Often, it may be advantageous, and as described in the embodiments herein, to use the same metal and the same process for concurrent formation of both patterned M1 and etch stop/cut stop layer with no added incremental implementation cost to the formation of M1 without an etch stop/cut stop. The patterned cut stop layer (e.g., made of aluminum) may be subsequently etched off and removed using a wet etch process in conjunction with a wet etch semiconductor thinning and/or texturing process. For instance, an initial pre-texture KOH-based etch may be used to selectively etch the aluminum etch stop/cut stop layer at the bottoms of the trenches after the trench formation process (e.g., using pulsed laser ablation) and prior to the texturing process (e.g., using a suitable alkaline or acidic texture process).

In some instances, the patterned etch stop or cut stop or ablation-stop may comprise a material different than first level metallization M1, however, in this case at least one extra processing step may be required. For example, the etch stop or cut stop may be an oxide layer screen printed or ink jet printed before or after the M1 pattern formation.

Embodiments for trench formation process endpointing include, but are not limited to, silicon separation process for forming silicon islands (tiles, or mini-cells) that prevents damage to and/or thinning of a backplane material utilizing a stop layer on the silicon backside at intended silicon separation regions where the silicon separation process can come to a stop. In other words, the trenching stop layer covers the area on the back of the silicon surface at the location for silicon cut for forming solar cell islands or subcells. The stop layer is electrically isolated from a first level metallization M1 and is not part of the solar cell interconnection or base and emitter metallization. Often it may be advantageous that the stop layer is the same material as M1 such that it can be formed at the same time and in the same process as a first level metallization M1 at no or negligible added cost. For example, the etch stop layer, as well as M1, can be formed by screen printing of metal paste or ink-jet printing followed by anneal, or evaporation or PVD followed by laser patterning or lithography. Alternatively, the etch stop may be a different material than M1, such as an oxide material.

Silicon cutting may be performed, for example, by pulsed laser ablation, mechanical sawing, ultrasonic cutting, air jet cutting, patterned plasma or wet etching, printing of an etch paste followed by etching activation and rinsing of the etch paste, or any combination of the methods above. For laser ablation silicon cutting the laser may have a wavelength of UV, green, or IR, (often advantageously IR) and the pulse length may be from picosecond to microseconds range (often advantageously nanoseconds).

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:
1. A method for forming a back contact back junction solar cell, comprising:
   forming base and emitter contact metallizations on the backside of a back contact back junction solar cell substrate;
   forming a trench-stop layer on the backside of a back contact back junction solar cell substrate and electrically isolated from said base and emitter contact metallizations, said trench-stop layer having a pattern for forming a plurality of semiconductor regions;
   forming an electrically insulating layer on said base and emitter contact metallizations and said trench-stop layer; and
   partitioning said back contact back junction solar cell substrate into said plurality of solar cell semiconductor regions on said electrically insulating layer based upon said pattern of said trench-stop layer,
   wherein said base and emitter contact metallizations and said trench stop layer are formed in the same process.

2. The method for forming the back contact back junction solar cell of claim 1, wherein said trench stop layer is formed using a screen printing process.

3. The method for forming the back contact back junction solar cell of claim 1, wherein said trench stop layer is formed using a deposition and patterning process.

4. The method for forming the back contact back junction solar cell of claim 1, wherein said base and emitter contact metallizations and said trench stop layer material are different materials.

5. The method for forming the back contact back junction solar cell of claim 1, further comprising passivating a dielectric layer on said semiconductor backside.

6. The method for forming the back contact back junction solar cell of claim 1, wherein partitioning said back contact back junction solar cell substrate into said plurality of solar cell semiconductor regions includes forming a trench isolation pattern through said back contact back junction solar cell substrate to said trench stop layer.

7. The method for forming the back contact back junction solar cell of claim 6, further comprising a cleaning or wet etch process step to removal debris or residue formed during said trench isolation pattern partitioning.

8. The method for forming the back contact back junction solar cell of claim 6, wherein said trench isolation pattern is formed using a pulsed laser ablation process.

9. The method for forming the back contact back junction solar cell of claim 8, wherein said pulsed laser ablation has an infrared wavelength.

10. The method for forming the back contact back junction solar cell of claim 8, wherein said pulsed laser ablation has a nanoseconds range pulse width.

11. A back contact back junction solar cell comprising:
a semiconductor layer with a background doping, comprising a sunlight-receiving frontside and a backside opposite said sunlight-receiving frontside;
a patterned first metal layer (MI) on said semiconductor layer backside, said patterned first metal layer having base and emitter metallizations;
a trench stop layer on the backside of a back contact back junction solar cell substrate and electrically isolated from said patterned first metal layer (MI), said trench stop layer having a pattern for forming a plurality of semiconductor regions; and
an electrically insulating layer attached to said semiconductor layer backside,
wherein said back contact back junction solar cell substrate is partitioned into said plurality of solar cell semiconductor regions on said electrically insulating layer based upon said pattern of said trench stop layer,
wherein said patterned first metal layer (MI) and said trench stop layer material are the same material.

12. The back contact back junction solar cell of claim 11, wherein said trench stop layer is electrically insulating.

13. The back contact back junction solar cell of claim 11, wherein said trench stop layer is an oxide.

14. The back contact back junction solar cell of claim 11, further comprising a passivating dielectric layer on said semiconductor backside.

15. The back contact back junction solar cell of claim 11, wherein said back contact back junction solar cell substrate is partitioned by a trench isolation pattern through said back contact back junction solar cell substrate to said trench stop layer.

16. A back contact back junction solar cell comprising:
a semiconductor layer with a background doping, comprising a sunlight-receiving frontside and a backside opposite said sunlight-receiving frontside;
a patterned first metal layer (MI) on said semiconductor layer backside, said patterned first metal layer having base and emitter metallizations;
a trench stop layer on the backside of a back contact back junction solar cell substrate and electrically isolated from said patterned first metal layer (MI), said trench stop layer having a pattern for forming a plurality of semiconductor regions; and
an electrically insulating layer attached to said semiconductor layer backside; wherein said back contact back junction solar cell substrate is partitioned into said plurality of solar cell semiconductor regions on said electrically insulating layer based upon said pattern of said trench stop layer, wherein said trench stop layer is electrically conductive.

17. A back contact back junction solar cell comprising:
a semiconductor layer with a background doping, comprising a sunlight-receiving frontside and a backside opposite said sunlight-receiving frontside;
a patterned first metal layer (MI) on said semiconductor layer backside, said patterned first metal layer having base and emitter metallizations;
a trench stop layer on the backside of a back contact back junction solar cell substrate and electrically isolated from said patterned first metal layer (MI), said trench stop layer having a pattern for forming a plurality of semiconductor regions; and
an electrically insulating layer attached to said semiconductor layer backside; wherein said back contact back junction solar cell substrate is partitioned into said plurality of solar cell semiconductor regions on said electrically insulating layer based upon said pattern of said trench stop layer, and further comprising:
a patterned second metal layer (M2) on said electrically insulating layer, said patterned second metal layer having base and emitter metallizations;
a plurality of electrically conductive via plugs formed through said electrically insulating layer interconnecting select portions of said patterned second level metal layer to select portions of said patterned first level metal layer; and
said patterned first level metal layer providing solar cell semiconductor region base and emitter metallizations and said patterned second level metal layer providing complete solar cell interconnections among said plurality of solar cell semiconductor regions.

* * * * *